United States Patent
Lee et al.

(10) Patent No.: US 12,484,343 B2
(45) Date of Patent: Nov. 25, 2025

(54) SINGLE CHIP MULTI BAND LIGHT EMITTING DIODE, LIGHT EMITTING DEVICE AND LIGHT EMITTING MODULE HAVING THE SAME

(71) Applicant: SEOUL VIOSYS CO., LTD., Gyeonggi-do (KR)

(72) Inventors: Chung Hoon Lee, Gyeonggi-do (KR); Yong Hyun Baek, Gyeonggi-do (KR); Ji Hun Kang, Gyeonggi-do (KR); Dae Hong Min, Gyeonggi-do (KR); Dae Sung Cho, Gyeonggi-do (KR); So Ra Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 847 days.

(21) Appl. No.: 17/673,068

(22) Filed: Feb. 16, 2022

(65) Prior Publication Data

US 2022/0262983 A1 Aug. 18, 2022

Related U.S. Application Data

(60) Provisional application No. 63/153,703, filed on Feb. 25, 2021, provisional application No. 63/150,280, filed on Feb. 17, 2021.

(51) Int. Cl.
*H10H 20/821* (2025.01)
*H01L 25/075* (2006.01)
(Continued)

(52) U.S. Cl.
CPC ........ *H10H 20/821* (2025.01); *H10H 20/813* (2025.01); *H10H 20/8252* (2025.01); *H01L 25/0753* (2013.01); *H10H 20/812* (2025.01)

(58) Field of Classification Search
CPC .............. H01L 25/0753; H10H 20/812; H10H 20/813; H10H 20/819; H10H 20/821;
(Continued)

(56) References Cited

U.S. PATENT DOCUMENTS

| | | | |
|---|---|---|---|
| 2010/0244042 A1* | 9/2010 | Saito | H10H 20/821 |
| | | | 257/E33.061 |
| 2019/0221730 A1* | 7/2019 | Yoo | H10H 20/8162 |

(Continued)

FOREIGN PATENT DOCUMENTS

| | | | |
|---|---|---|---|
| CN | 105870286 A | * | 8/2016 |
| KR | 1020100073702 A | | 7/2010 |

(Continued)

OTHER PUBLICATIONS

Extended European Search Report for European Application No. 22756504.1, Dec. 20, 2024, 7 pages.
English translation of Search Report issued in corresponding International Application No. PCT/KR2022/002318, mailed Jun. 7, 2022, 2 pages.

*Primary Examiner* — Matthew C Landau
*Assistant Examiner* — Dmitriy Yemelyanov
(74) *Attorney, Agent, or Firm* — LaBatt, LLC

(57) ABSTRACT

A light emitting diode includes an n-type nitride semiconductor layer, a V-pit generation layer disposed on the n-type nitride semiconductor layer and having V-pits, an active layer disposed on the V-pit generation layer and including a first well region formed along a flat surface of the V-pit generation layer and a second well region formed in the V-pit of the V-pit generation layer, a p-type nitride semiconductor layer disposed on the active layer and a sub-emission layer interposed between the n-type nitride semiconductor layer and the p-type nitride semiconductor layer and disposed near the active layer. The sub-emission layer may emit light having a peak wavelength within a range of wavelengths shorter than a peak wavelength of the first well (Continued)

region, and light emitted from the light emitting diode is within a range of $0.205 \leq X \leq 0.495$ and $0.265 \leq Y \leq 0.450$ in CIE color coordinates (X, Y).

16 Claims, 10 Drawing Sheets

(51) Int. Cl.
*H10H 20/812* (2025.01)
*H10H 20/813* (2025.01)
*H10H 20/825* (2025.01)

(58) Field of Classification Search
CPC ............ H10H 20/8215; H10H 20/825; H10H 20/8252; H10H 20/857
See application file for complete search history.

(56) References Cited

U.S. PATENT DOCUMENTS

2019/0348567 A1 11/2019 Na et al.
2023/0335672 A1* 10/2023 Liu .................... H10H 20/0137

FOREIGN PATENT DOCUMENTS

| KR | 1020150112274 A | 10/2015 | | |
|---|---|---|---|---|
| KR | 1020160058321 A | 5/2016 | | |
| KR | 1020170063211 A | 6/2017 | | |
| KR | 1020180080854 A | 7/2018 | | |
| WO | WO-2016017884 A1 * | 2/2016 | ............. | H01L 33/22 |
| WO | WO-2022109797 A1 * | 6/2022 | ......... | H01L 33/0075 |

* cited by examiner

SINGLE CHIP MULTI BAND LIGHT EMITTING DIODE, LIGHT EMITTING DEVICE AND LIGHT EMITTING MODULE HAVING THE SAME

CROSS-REFERENCE OF RELATED APPLICATIONS AND PRIORITY

The Present Application is a non-provisional application which claims priority and benefit of U.S. Provisional Application Ser. Nos. 63/150,280 filed Feb. 17, 2021 and 63/153,703 filed Feb. 25, 2021, the disclosure of which are incorporated by reference as if they are fully set forth herein.

TECHNICAL FIELD

The present disclosure relates to a light emitting diode, and more particularly, to a light emitting diode that emits light having multi-bands at a single chip level.

BACKGROUND

Nitride semiconductors are used as light sources for displaying apparatuses, traffic lights, lighting, or optical communication devices, and may be mainly used for light emitting diodes or laser diodes that emit blue or green light. In addition, the nitride semiconductor may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light of a specific wavelength depending on a composition of a well layer in the quantum well structure. To increase internal quantum efficiency and reduce losses due to light absorption, the light emitting diode is designed to emit a spectrum of light having a single peak, i.e. monochromatic light.

It is difficult to implement mixed-color light emitted from lighting, for example, white light as a single-peak monochromatic light. Accordingly, techniques of implementing white light by using a plurality of light emitting diodes together emitting different monochromatic light from one another or by using phosphors converting a wavelength of light emitted from the light emitting diode may be used.

The use of phosphors is accompanied by the cost of phosphors themselves or a decrease in efficiency known as Stoke's shift. In addition, it is accompanied by the process of applying phosphors on the light emitting diode and yellowing of a carrier carrying phosphors.

Using a mixture of a plurality of light emitting diodes also may complicate the process, and it is inconvenient to prepare the light emitting diodes made of different materials from one another.

Therefore, if light having a spectrum of multi-band can be implemented using a single-chip light emitting diode, the use of the plurality of light emitting diodes may be avoided, and many existing drawbacks may be addressed and there is no need to use phosphors.

There have been attempts to implement light having the spectrum of multi-bands by varying compositions of well layers in a conventional quantum well structure, but it is difficult to generate light having multi-bands because recombination of electrons and holes mainly occurs in a particular well layer. In addition, even when light having multi-band is generated, independent control according to a wavelength range is difficult, and efficiency may be reduced.

SUMMARY

Exemplary embodiments provide a light emitting diode of a novel structure capable of implementing light having a spectrum of multi bands at a single chip level, and a light emitting device and a light emitting module having the same.

Exemplary embodiments provide a light emitting diode having improved light emitting efficiency, and a light emitting device and a light emitting module having the same.

A light emitting diode according to an exemplary embodiment of the present disclosure includes an n-type nitride semiconductor layer, a V-pit generation layer disposed on the n-type nitride semiconductor layer and having V-pits, an active layer disposed on the V-pit generation layer, and including a first well region formed along a flat surface of the V-pit generation layer and a second well region formed in the V-pit of the V-pit generation layer, a p-type nitride semiconductor layer disposed on the active layer, and a sub-emission layer interposed between the n-type nitride semiconductor layer and the p-type nitride semiconductor layer and adjacent to the active layer. The sub-emission layer may emit light having a peak wavelength within a region of wavelengths shorter than a peak wavelength of the first well region, and light emitted from the light emitting diode is within a range of $0.205 \leq X \leq 0.495$ and $0.265 \leq Y \leq 0.450$ in CIE color coordinates (X, Y).

The active layer may emit light having at least two different peak wavelengths at a single chip level.

The first well region may have an In content greater than that of the second well region.

The first well region may emit light having a yellow peak wavelength within a range of 570 nm to 590 nm, and the second well region may emit light having a blue peak wavelength within a range of 400 nm to 500 nm.

The first well region may be thicker than the second well region.

The sub-emission layer may include a well layer and a capping layer.

The sub-emission layer may have an In content smaller than that of the first well region.

The sub-emission layer may be disposed between the active layer and the V-pit generation layer, and may be in contact with the active layer.

The sub-emission layer may have V-pits.

The well layer of the sub-emission layer may have an energy bandgap wider than that of the well layer of the first well region.

A lattice constant of the sub-emission layer may have a value that is intermediate between a lattice constant of the V-pit generation layer and a lattice constant of the active layer.

The sub-emission layer may be in contact with an upper portion of the active layer.

The sub-emission layer may include a lower sub-emission layer in contact with a lower portion of the active layer; and an upper sub-emission layer in contact with the upper portion of the active layer.

The sub-emission layer, the first well region, and the second well region may emit light having at least three different peak wavelengths at a single chip level.

The sub-emission layer may emit blue light, the second well region may emit blue light having a peak wavelength within a range of shorter wavelengths or longer wavelengths than that of the sub-emission region, and the first well region may emit yellow light.

The light emitting diode may further include an electron blocking layer between the active layer and the p-type nitride semiconductor.

A light emitting device according to an exemplary embodiment includes: a light emitting diode; and a light transmitting layer disposed on the light emitting diode. The light emitting diode may include an n-type nitride semiconductor layer; a V-pit generation layer disposed on the n-type nitride semiconductor layer and having V-pits; an active layer disposed on the V-pit generation layer, and including a first well region formed along a flat surface of the V-pit generation layer and a second well region formed in the V-pit of the V-pit generation layer; a p-type nitride semiconductor layer disposed on the active layer; and a sub-emission layer interposed between the n-type nitride semiconductor layer and the p-type nitride semiconductor layer and disposed near the active layer, in which the sub-emission layer emits light having a peak wavelength within a range of wavelengths shorter than a peak wavelength of the first well region.

The light transmitting layer may be a single layer or multi-layers.

Furthermore, the light emitting diode may further include a substrate, and the n-type nitride semiconductor layer may be disposed on the substrate. The light transmitting layer may include a first light transmitting layer and a second light transmitting layer covering the first light transmitting layer. Furthermore, the second light transmitting layer may cover a side surface of the substrate together with an upper surface of the substrate.

A light emitting module according to an exemplary embodiment may include a circuit board, a light emitting device arranged on the circuit board, and a light transmitting layer covering the light emitting device. The light emitting device may include a light emitting diode, in which the light emitting diode includes an n-type nitride semiconductor layer, a V-pit generation layer disposed on the n-type nitride semiconductor layer and having V-pits, an active layer disposed on the V-pit generation layer, and including a first well region formed along a flat surface of the V-pit generation layer and a second well region formed in the V-pit of the V-pit generation layer, a p-type nitride semiconductor layer disposed on the active layer, and a sub-emission layer interposed between the n-type nitride semiconductor layer and the p-type nitride semiconductor layer and disposed near the active layer. The sub-emission layer emits light having a peak wavelength within a range of wavelengths shorter than a peak wavelength of the first well region.

DETAILED DESCRIPTION OF EMBODIMENTS

Figure 1:
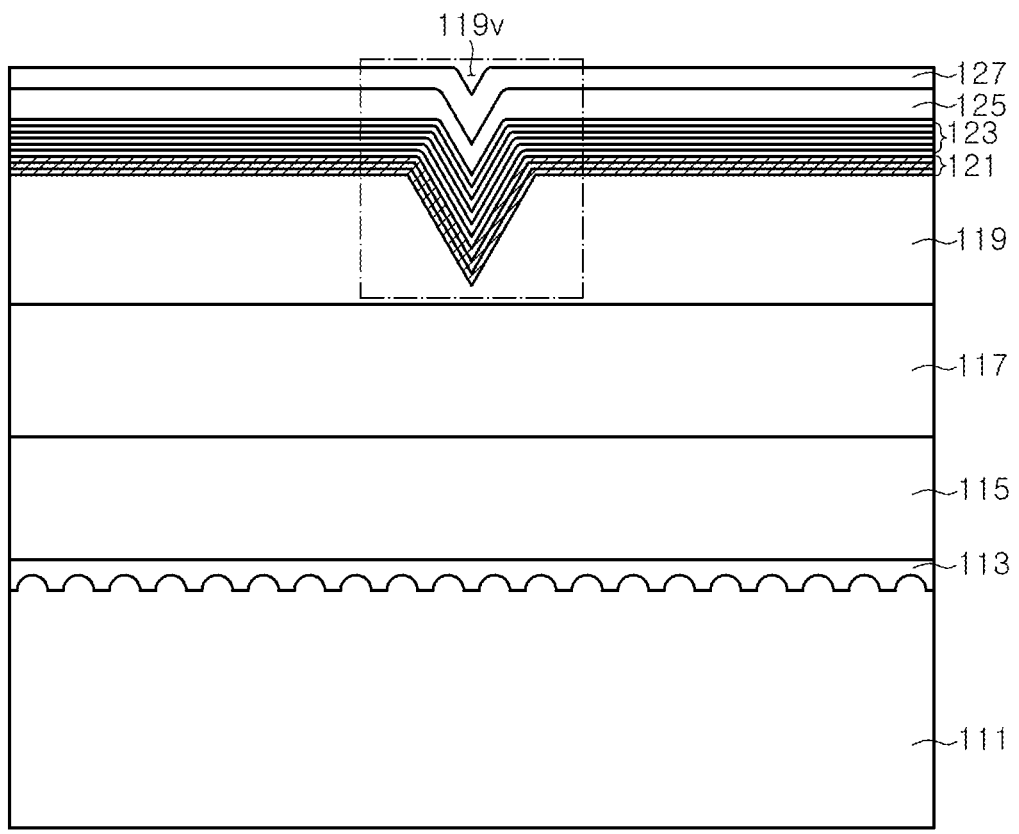
FIG. 1 is a schematic cross-sectional view illustrating a light emitting diode according to an exemplary embodiment.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 2A:
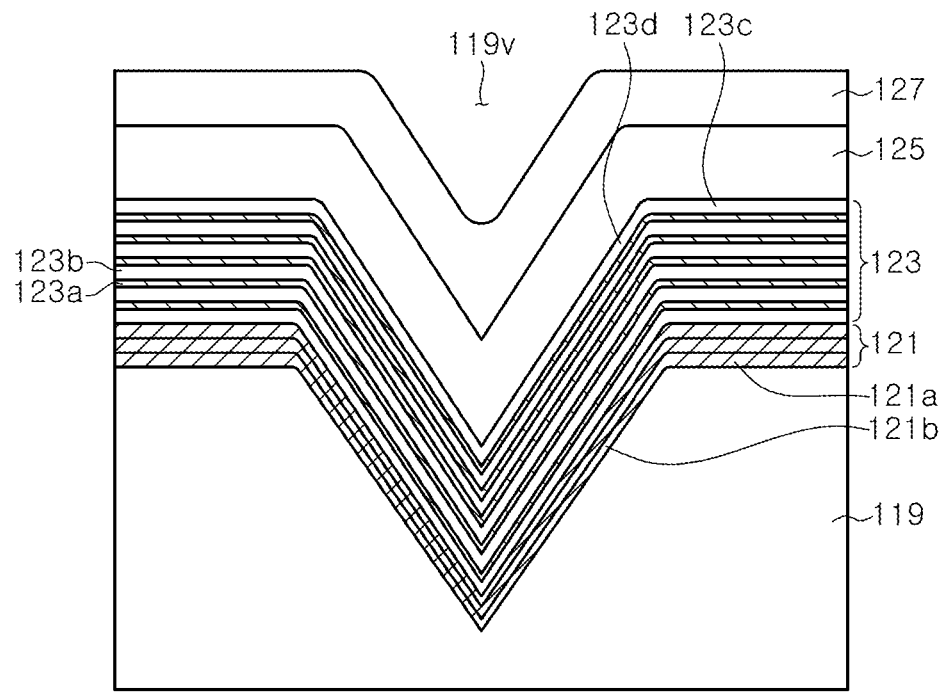
FIG. 2A is a schematic partial cross-sectional view showing an enlarged portion of FIG. 1.
Figure 2B:
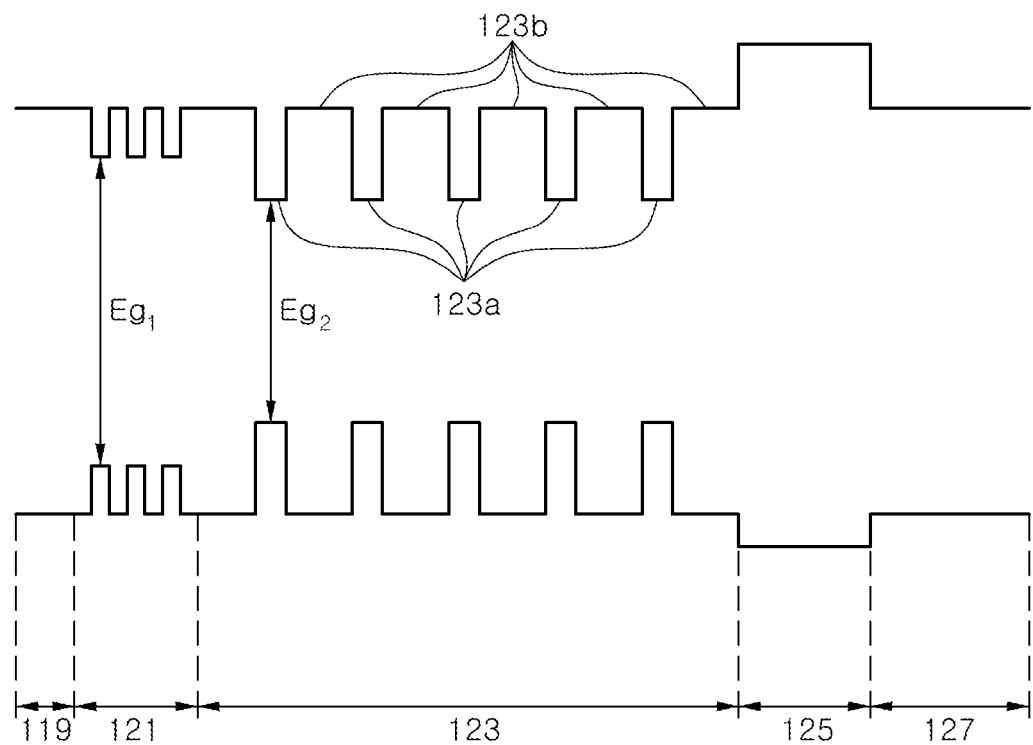
FIG. 2B is a diagram showing an energy band diagram of FIG. 2A.
Figure 2C:
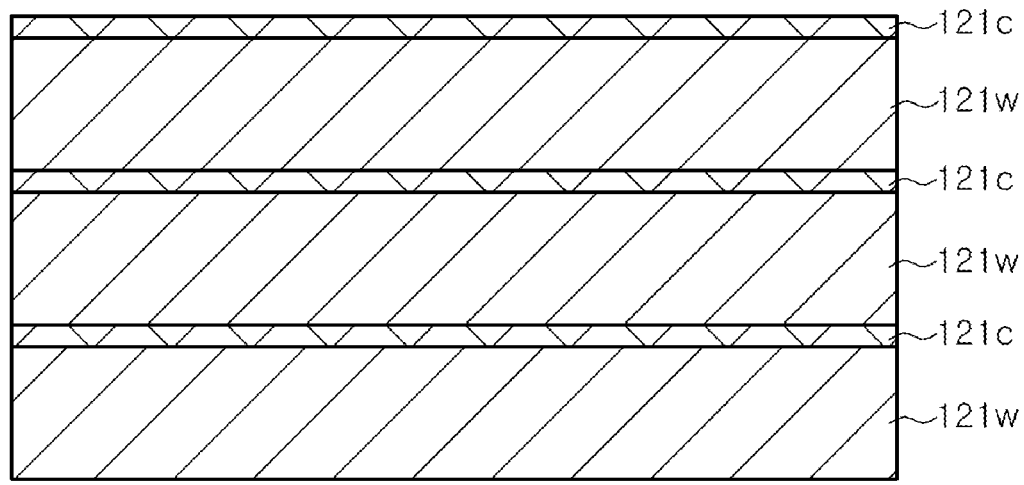
FIG. 2C is a schematic partial cross-sectional view showing an enlarged view of a sub-emission layer of FIG. 2A.

FIG. 1 is a schematic cross-sectional view illustrating a light emitting diode 100 according to an exemplary embodiment. FIG. 2A is a schematic partial cross-sectional view showing an enlarged portion of FIG. 1, FIG. 2B illustrates an energy band diagram of FIG. 2A, and FIG. 2C is a schematic partial cross-sectional view showing an enlarged view of a sub-emission layer 121 of FIG. 2A.

Referring to FIG. 1, FIG. 2A, FIG. 2B, and FIG. 2C, the light emitting diode 100 may include a substrate 111, a nucleation layer 113, a high-temperature buffer layer 115, an n-type nitride semiconductor layer 117, and a V-pit generation layer 119, a sub-emission layer 121, an active layer 123, an electron blocking layer 125, and a p-type nitride semiconductor layer 127.

The substrate 111 is for growing a gallium nitride-based semiconductor layer, and a sapphire substrate, a SiC substrate, a Si substrate, a GaN substrate, a spinel substrate, and the like may be used. The substrate 111 may have protrusions as shown in FIG. 1, and may be, for example, a patterned sapphire substrate. However, the inventive concepts are not limited thereto, and for example, the substrate 111 may be a substrate having a flat upper surface, such as a flat sapphire substrate.

The nucleation layer 113 may be formed on the substrate 111. The nucleation layer 113 may be formed of (Al, Ga)N at a low temperature of 400° C. to 600° C., and for example, may be formed of AlGaN or GaN. A composition of the nucleation layer 113 may be changed depending on the substrate 111. For example, when the substrate 111 is a patterned sapphire substrate, the nucleation layer 113 may be formed of AlGaN, and when the substrate 111 is a sapphire substrate having a flat upper surface, the nucleation layer 113 may be formed of GaN. The nucleation layer 113 may be formed to have a thickness of, for example, about 25 nm.

The high-temperature buffer layer 115 may be formed on the nucleation layer 113. The high-temperature buffer layer 115 may be grown at a relatively high temperature so as to alleviate an occurrence of defects such as dislocations between the substrate 111 and the n-type nitride semiconductor layer 117. The high-temperature buffer layer 115 may be formed of undoped GaN or GaN doped with n-type impurities. While the high-temperature buffer layer 115 is formed, a threading dislocation may be generated due to a lattice mismatch between the substrate 111 and the high-temperature buffer layer 115.

The n-type nitride semiconductor layer 117 may be formed on the high-temperature buffer layer 115. The n-type nitride semiconductor layer 117 may be a nitride-based semiconductor layer doped with n-type impurities, for example, a nitride semiconductor layer doped with Si. A doping concentration of Si doped into the n-type nitride semiconductor layer 117 may be $5 \times e^{17}/cm^3$ to $5 \times e^{19}/cm^3$. The n-type nitride semiconductor layer 117 may be grown under a growth pressure of 150 Torr to 200 Torr at 1000° C. to 1200° C. (e.g., 1050° C. to 1100° C.) by supplying metal source gases into a chamber using the Metal Organic Chemical Vapor Deposition (MOCVD) technology. In this case, the n-type nitride semiconductor layer 117 may be continuously formed on the high-temperature buffer layer 115, and a threading dislocation D formed in the high-temperature buffer layer 115 may be transferred to the n-type nitride semiconductor layer 117. The n-type nitride semiconductor layer 117 may be formed to be relatively thinner than the high-temperature buffer layer 115, for example, to have a thickness of about 2.5 μm.

The V-pit generation layer 119 may be disposed in an upper portion of the n-type nitride semiconductor layer 117. In some embodiments, the V-pit generation layer 119 may be formed of, for example, a GaN layer. The V-pit generation layer 119 may be grown at a relatively lower temperature than that of the n-type nitride semiconductor layer 117, for example, about 900° C. and thus, V-pits 119v may be formed in the V-pit generation layer 119.

As the V-pit generation layer 119 is grown at the relatively lower temperature than that of the n-type nitride semiconductor layer 117, a crystal quality may be artificially deteriorated and a three-dimensional growth may be promoted to generate the V-pits 119v. The V-pits 119v may have a hexagonal pyramid shape when a growth surface of the nitride semiconductor layer is a c-plane. The V-pits 119v may be formed at an upper end of the threading dislocation.

The V-pit generation layer 119 may be formed to have a thickness smaller than that of the n-type nitride semiconductor layer 117, for example, to have a thickness of about 450 nm to 600 nm. Sizes of the V-pits 119v formed in the V-pit generation layer 119 may be adjusted through a growth condition and a growth time of the V-pit generation layer 119. In the exemplary embodiment of the present disclosure, the sizes of the V-pits 119v formed in the V-pit generation layer 119 may affect generation of light having a multi-band spectrum. In the exemplary embodiment of the present disclosure, the V-pit generation layer 119 is described as a single layer, without being limited thereto, or may be multi-layers. For example, the V-pit generation layer 119 may include at least two layers among GaN, AlGaN, InGaN, or AlGaInN layers.

The sub-emission layer 121 is disposed on the V-pit generation layer 119, and disposed adjacent to the active layer 123 which will be described later. The sub-emission layer 121 may emit light having a predetermined energy by recombination of electrons and holes. As shown in FIG. 2C, the sub-emission layer 121 may have three well layers 121w, without being limited thereto, or may include at least one well layer 121w. The well layer 121w of the sub-emission layer 121 may include a nitride semiconductor layer such as $In_xAl_yGa_{1-x-y}N$ ($0 \leq x \leq 1$, $0 \leq y \leq 1$), and for example, it may be InGaN. The sub-emission layer 121 may be grown at a temperature relatively lower than that of the V-pit generation layer 119, or may be grown at a temperature relatively higher than that of the active layer 123. An Indium (In) content ("In content") of the sub-emission layer 121 may be smaller than that of the active layer 123, and an energy band gap Eg1 of the sub-emission layer 121 may be greater than an energy band gap Eg2 of the active layer 123. The energy band gaps Eg1 and Eg2 of the sub-emission layer 121 and the active layer 123 may vary depending on the In content, and as the In content decreases, the energy band gap may increase.

In an exemplary embodiment, when the sub-emission layer 121 is disposed on a lower portion of the active layer 123, the In contents may increase in the order of the V-pit generation layer 119, the sub-emission layer 121, and the active layer 123. Accordingly, it is possible to reduce the transfer of stress and strain generated by a lattice mismatch between the nitride semiconductor layer and the substrate 111 to the active layer 123, and propagation of defects such as dislocations may be prevented. In addition, a lattice constant of the sub-emission layer 121 may have a value intermediate that is between a lattice constant of the V-pit generation layer 119 and a lattice constant of the active layer 123 and thus, the sub-emission layer 121 may reduce a difference in the lattice constants between the V-pit generation layer 119 and the active layer 123. Accordingly, a crystal quality of the active layer 123 may be improved by the sub-emission layer 121. The sub-emission layer 121 may function as a superlattice layer for alleviating the difference in lattice constants. In an exemplary embodiment, the light emitting diode may further include a superlattice layer between the V-pit generation layer 119 and the active layer 123 in addition to the sub-emission layer 121.

Light generated from the sub-emission layer 121 and the active layer 123 may have a first exiting surface and a second exiting surface on upper and lower portions of the substrate 111. That is, light generated from the sub-emission layer 121 and the active layer 123 may be emitted upward from the substrate 111 through the first exiting surface, or may be emitted downward from the substrate 111 through the second exiting surface opposite to the first exiting surface.

For light within a shorter wavelength range emitted from the sub-emission layer 121, an extraction efficiency of light emitted to the second exiting surface may be higher than that of light emitted to the first exiting surface. This is related to the energy band gaps of the active layer 123 emitting light of a longer wavelength and the sub-emission layer 121 emitting light of a shorter wavelength.

As shown in FIGS. 2A-2B, the active layer 123 having the energy band gap Eg2, which is shallower than the energy band gap Eg1 of the sub-emission layer 121, is disposed adjacent to the p-type nitride semiconductor layer 127. Most of holes injected from the p-type nitride semiconductor layer 127 may be recombined in the active layer 123 due to a higher barrier for the holes injected from the p-type nitride semiconductor layer 127, and a recombination rate in the sub-emission layer 121 decreases, thereby reducing radiation efficiency. In addition, the well layers of the sub-emission layer 121 have the energy band gaps Eg1 higher than those of the well layers of the active layer 123, a portion of light generated in the sub-emission layer 121 may be absorbed by the active layer 123. Accordingly, a structure of the light emitting diode according to the exemplary embodiment of the present disclosure may be suitable for a light emitting diode having a vertical structure or a flip-chip type structure that emits light through the second exiting surface in the lower portion of the substrate 111 so as to reduce light loss.

The sub-emission layer 121 may be formed along an upper surface of the V-pit generation layer 119. As shown in FIG. 2A, the sub-emission layer 121 may include a first sub-emission region 121a formed over a flat surface of the V-pit generation layer 119 and a second sub-emission region 121b formed in the V-pit 119v. An inclined surface in the V-pit 119v may have a relatively low growth rate and thus, a thickness of the second sub-emission region 121b formed on the inclined surface in the V-pit 119v may be formed to be smaller than that of the first sub-emission region 121a.

The thickness of the second sub-emission region 121b in the V-pit 119v may vary depending on a size of the V-pit 119v. The size of the V-pit 119v may be adjusted by adjusting a deposition time, a growth temperature, and the like of the V-pit generation layer 119. In addition, a well layer included in the second sub-emission region 121b may be formed of InGaN having an In content lower than that of a well layer included in the first sub-emission region 121a. The second sub-emission region 121b may not emit light because the In content thereof is too small, without being limited thereto, or it may emit light depending on driving conditions.

The active layer 123 may be disposed on the sub-emission layer 121. The active layer 123 may emit light having a predetermined energy by recombination of electrons and holes. In addition, the active layer 123 may have a single quantum well structure or a multi quantum well (MQW) structure in which quantum barrier layers and quantum well layers are alternately stacked. The quantum barrier layer may be formed of a nitride semiconductor layer such as GaN, InGaN, AlGaN, AlInGaN, or the like having a band gap wider than that of the quantum well layer.

As shown in FIG. 2A, the active layer 123 may include a well layer 123a and a barrier layer 123b, and may be in contact with the sub-emission layer 121, without being limited thereto. The active layer 123 may be formed along the V-pit 119v, and a thickness of the active layer 123 formed in the V-pit 119v may be smaller than that of the active layer 123 formed over a flat upper surface of the V-pit generation layer 119. The thickness of the active layer 123 in the V-pit 119v may vary depending on the size of the V-pit 119v.

Meanwhile, the well layer 123a may be formed of $In_xAl_yGa_{1-x-y}N$ (0≤x≤1, 0≤y≤1). Composition ratios of In, Al, and Ga may be selected depending on required light. The active layer 123 may include a first well region 123c formed on the flat surface of the V-pit generation layer 119 and a second well region 123d formed in the V-pit 119v. The first well region 123c may have a composition emitting light having a longer wavelength band of the multi-bands, and the second well region 123d may have a composition emitting light having a shorter wavelength band of the multi-bands. For example, the first well region 123c may be formed of $In_xAl_yGa_{1-x-y}N$ (0≤x≤1, 0≤y≤1) so as to emit yellow light having 570 nm to 590 nm, and the second well region 123d may be formed of $In_xAl_yGa_{1-x-y}N$ (0≤x≤1, 0≤y≤1) so as to emit blue light having 400 nm to 500 nm, without being limited thereto. Light emitted from the first well region 123c and the second well region 123d may have different wavelengths from each other, and white light may be implemented by a combination of light emitted from the first well region 123c and the second well region 123d.

The second well region 123d may be formed on each surface of the V-pit 119v to have a same composition, without being limited thereto, or may be formed to have a different composition on each surface. Accordingly, the light emitting diode of the present disclosure may implement light having at least two bands at a single chip level using the first well region 123c and the second well region 123d. In addition, the light emitting diode may emit light having a shorter wavelength with a stronger intensity due to light having a shorter wavelength emitted from the sub-emission layer 121, as well as light having a shorter wavelength emitted from the second well region 123d of the active layer 123. Accordingly, white light having a correlated color temperature (CCT) within a range of 3000K to 7000K may be implemented, and the CCT may be adjusted depending on an intended use.

The active layer 123 may emit light having at least two bands. However, the first well region 123c and the second well region 123d are formed together in the same process, and it may be difficult to control a thickness and an In composition of the second well region 123d of the active layer 123 that emits light having a shorter wavelength. That is, as an In content in the second well region 123d is substantially dependent on an In content in the first well region 123c, it may be difficult to control a peak wavelength and an intensity of light within a shorter wavelength range emitted from the second well region 123d.

On the contrary, as the sub-emission layer 121 may be grown under a condition different from that of the active layer 123, an In composition and a thickness thereof may be freely adjusted. Accordingly, by disposing the sub-emission layer 121, it is possible to independently control a peak wavelength of light within a desired shorter wavelength range, and it is possible to increase an intensity of light within a corresponding wavelength range. In addition, light with the shorter wavelength emitted from the second well region 123d may be reinforced by using the sub-emission layer 121.

Meanwhile, the barrier layer 123b may be formed of a nitride semiconductor layer such as GaN, InGaN, AlGaN, AlInGaN, or the like which has an energy band gap wider than that of the well layer 123a. For example, when the first well region 123c is formed of InGaN so as to emit yellow light, the barrier layer 123b may be formed of InGaN having an In content lower than that of the well layer 123a.

A capping layer (not shown) may be interposed between the well layer 123a and the barrier layer 123b. The capping layer may be formed before depositing the barrier layer 123b so as to prevent dissociation of In in the well layer 123a while the barrier layer 123b is deposited. The capping layer may include Al, and for example, may be formed of AlGaN or AlInGaN. An Al composition contained in a first capping layer portion, that is, a capping layer portion disposed over the flat surface of the V-pit generation layer 119 may be different from that in a second capping layer portion, that is, a capping layer portion formed in the V-pit 119v. An Al content in the first capping layer portion may be greater than that in the second capping layer portion. For example, the Al composition in the first capping layer portion may be 10 atomic % or more, further 12 atomic % or more with respect to a total composition in the capping layer, and the Al composition in the second capping layer portion may be about 5 atomic % or more with respect to the total composition in the capping layer.

In the exemplary embodiment of the present disclosure, the well layers of the sub-emission layer 121 may have a composition emitting light having a shorter wavelength than that of the first well region 123c of the active layer 123. For example, when the first well region 123c of the active layer 123 is formed of $In_xAl_yGa_{1-x-y}N$ (0≤x≤1, 0≤y≤1) so as to emit yellow light having a central wavelength within a range of 570 nm to 590 nm, the well layers of the sub-emission layer 121 may be formed of $In_xAl_yGa_{1-x-y}N$ (0≤x≤1, 0≤y≤1) having an In content lower than that of the first well region 123c of the active layer 123. The sub-emission layer 121 may emit blue light within a range of 400 nm to 500 nm, which is a shorter central wavelength than that of the first well region 123c of the active layer 123. However, the inventive concepts are not limited thereto. As long as a combination of light emitted from the first well region 123c of the active layer 123 and the sub-emission layer 121 is a combination implementing white light, the wavelength of light emitted from the first well region 123c of the active layer 123 and the sub-emission layer 121 is not particularly limited. Meanwhile, the second well region 123d of the active layer 123 may emit blue or green light. In an exemplary embodiment, the sub-emission layer 121 may emit light having the same color as that of light emitted from the second well region 123d of the active layer 123. A peak wavelength of light emitted from the sub-emission layer 121 may be similar to, or may be identical to, a peak wavelength of light generated in the second well region 123d.

In some forms, the sub-emission layer 121 may adjust the wavelength of light emitted from the sub-emission layer 121 by changing a growth temperature when each well layer is grown. For example, by growing the well layer of the sub-emission layer 121 at a relatively low temperature, the In content of the well layer may be increased. Accordingly, the sub-emission layer 121 may generate light having a longer wavelength than the peak wavelength of light generated in the second well region 123d of the active layer 123. In an exemplary embodiment, the first well region 123c of the active layer 123 may emit yellow light, the second well region 123d of the active layer 123 may emit blue light, and the sub-emission layer 121 may emit blue light having a wavelength shorter than that of yellow light emitted from the first well region 123c and longer than that of blue light emitted from the second well region 123d. In another exemplary embodiment, the sub-emission layer 121 may emit light having a wavelength shorter than that of light emitted from the second well region 123d.

The light emitting diode may implement light having at least two or more bands, further three or more bands at a single chip level through at least two bands of light emitted from the active layer 123 and at least one band of light emitted from the sub-emission layer 121. In addition, a peak wavelength of blue light emitted from the second well region 123d and a peak wavelength of blue light emitted from the sub-emission layer 121 may be close to each other and may be substantially identical. Accordingly, the light emitting diode of the present disclosure may emit light having a shorter wavelength range with a stronger intensity than that of a light emitting diode that emits light having a shorter wavelength by using the second well region 123d alone without the sub-emission layer 121 and thus, cold white light having a low color temperature may be implemented.

In an exemplary embodiment, the well layers in the sub-emission layer 121 may be grown at an identical temperature to one another. In another exemplary embodiment, when a plurality of well layers of the sub-emission layer 121 is included, the peak wavelength of light emitted from the sub-emission layer 121 may be adjusted by varying growth temperatures of the plurality of well layers.

The sub-emission layer 121 may further include a capping layer 121c, and the capping layer 121c may be disposed on each well layer 121w of the sub-emission layer 121. The capping layer 121c may be formed of, for example, AlGaN or AlInGaN, and may have a band gap wider than that of the well layer 121w of the sub-emission layer 121 to function as a capping layer. The capping layer 121c may be formed so as to prevent dissociation of In in the well layer 121w of the sub-emission layer 121, while the well layer 121w or the active layer 123 of the sub-emission layer 121 is deposited. The sub-emission layer 121 may also function as a barrier layer of the active layer 123 and thus, a separate barrier layer may not be included, thereby reducing a thickness of the light emitting diode.

The capping layer 121c may include a first capping layer formed over the flat surface of the V-pit generation layer 119 and a second capping layer formed in the V-pit generation layer 119v. An Al composition contained in the first capping layer may be different from that contained in the second capping layer formed in the V-pit 119v. For example, an Al content of the first capping layer may be greater than that of the second capping layer formed in the V-pit 119v. An electron blocking layer 125 may be disposed on the active layer 123. The electron blocking layer 125 layer may be formed of, for example, a p-type AlGaN, without being limited thereto, or may be formed of AlInGaN or the like. The electron blocking layer 125 may also be formed in the V-pit 119v. The p-type AlGaN of the electron blocking layer 125 may be expressed by General Formula $Al_xGa_{1-x}N$, where x may be greater than 0 and less than 0.3. Meanwhile, in the exemplary embodiment of the present disclosure, a thickness of the electron blocking layer 125 may be less than about 100 nm.

The electron blocking layer 125 may perform an electron blocking function by adjusting an energy band gap and at the same time, may effectively prevent current leakage. The electron blocking layer 125 has a relatively high energy band gap and prevents electron overflow to increase an electron recombination rate.

The p-type nitride semiconductor layer 127 may be formed on the electron blocking layer 125. The p-type nitride semiconductor layer 127 may be formed of a semiconductor layer doped with p-type impurities such as Mg, for example, GaN. The p-type nitride semiconductor layer 127 may be a single layer or multi-layers, and may include a p-type contact layer. The p-type nitride semiconductor layer 127 may have a concave groove in the V-pit 119v. Since the p-type nitride semiconductor layer 127 has the concave groove on the V-pit 119v, a path through which light emitted from the second well region 123d passes through the p-type nitride semiconductor layer 127 may be shortened, and thus, light loss due to the p-type nitride semiconductor layer 127 may be reduced.

According to the illustrated exemplary embodiment, light emitted through the n-type nitride semiconductor layer 117 or the p-type nitride semiconductor layer 127 may be white light within a range of $0.205 \leq X \leq 0.495$ and $0.265 \leq Y \leq 0.450$ in CIE color coordinates (X, Y).

Figure 3A:
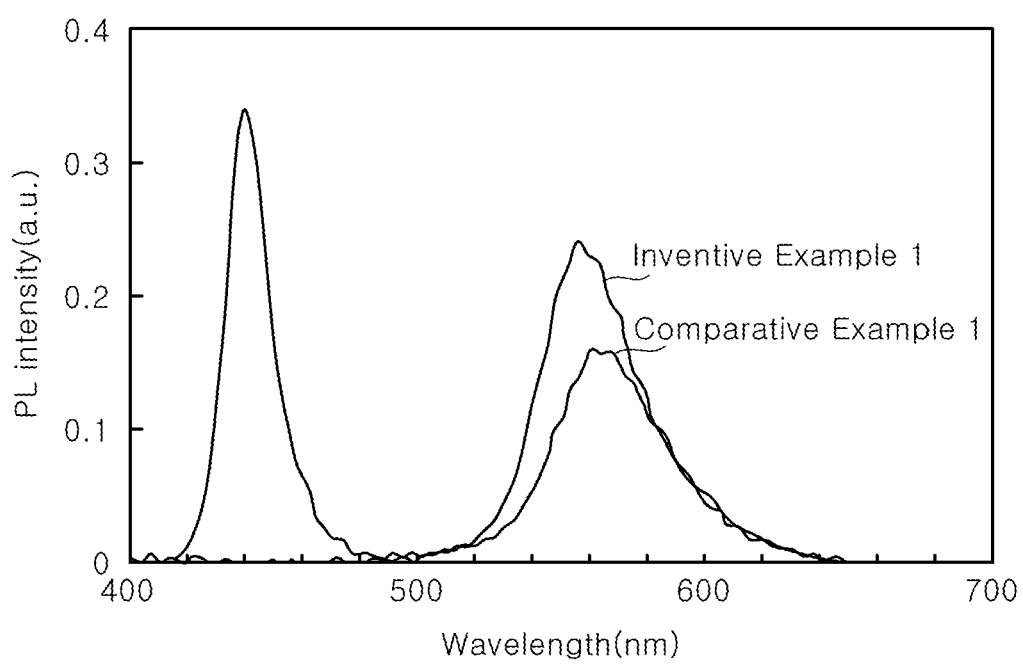
FIG. 3A is a graph showing photoluminescence (PL) intensities of light emitting diodes according to Comparative Example 1 and Inventive Example 1.
Figure 3B:
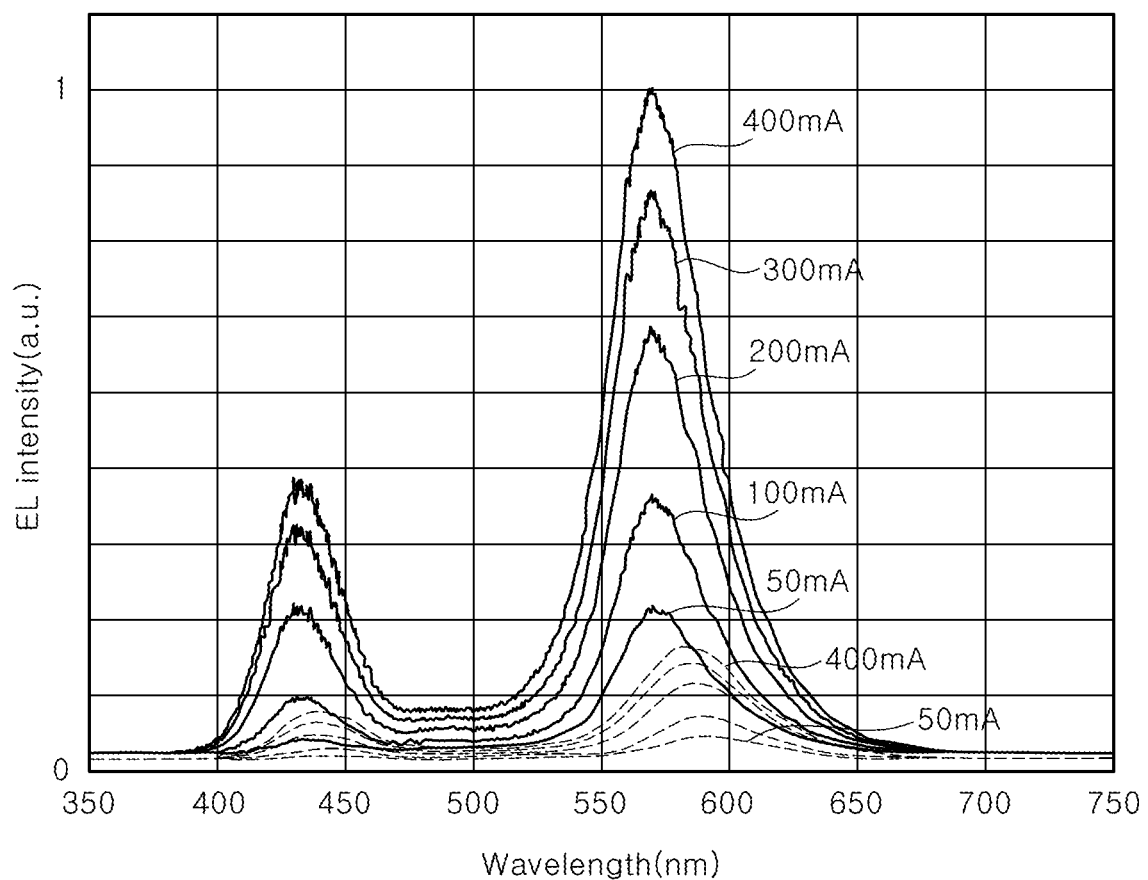
FIG. 3B is a graph showing electroluminescence (EL) intensities of light emitting diodes according to Comparative Example 1 and Inventive Example 1.

FIG. 3A is a graph showing photoluminescence (PL) intensities of light emitting diodes according to Comparative Example 1 and Inventive Example 1, and FIG. 3B is a graph showing electroluminescence (EL) intensities of light emitting diodes according to Comparative Example 1 and Inventive Example 1. For the light emitting diodes of the Comparative Example 1 and the Inventive Example 1, EL intensities depending on wavelengths were measured in a current range of 50 mA to 400 mA, respectively.

The light emitting diodes of the Comparative Example 1 and the Inventive Example 1 have similar structures except for the presence or absence of the sub-emission layer 121, and are manufactured by growing semiconductor layers on the substrate 111 under similar process conditions. The Inventive Example 1 includes the sub-emission layer 121 disposed near the active layer 123, whereas the Comparative Example 1 does not include the sub-emission layer 121.

Referring to FIG. 3A, in a PL spectrum of the Comparative Example 1, a band in a longer wavelength range is observed, but a band in a shorter wavelength range is not observed. Considering light in the shorter wavelength range is observed in an EL spectrum of FIG. 3B, it seems that light in the shorter wavelength range is not observed in the PL spectrum because a relative area of the V-pit 119v is small compared to an area of the flat portion. Meanwhile, in a PL spectrum of the Inventive Example 1, distinct bands were observed in a longer wavelength range and a shorter wavelength range, respectively. As there is a difference between the Comparative Example 1 and the Inventive Example 1 in the presence or absence of the sub-emission layer 121, the band of the shorter wavelength range observed in the PL spectrum of the Inventive Example 1 may be considered to be attributed to the sub-emission layer 121.

In FIG. 3B, the EL spectrum of the Comparative Example 1 is indicated by a dotted line, and the EL spectrum of the Inventive Example 1 is indicated by a solid line. In the EL spectrum of the Comparative Example 1, as a current increases from 50 mA to 400 mA, a band of the longer wavelength range and a band of the shorter wavelength range are observed together. The band of the longer wavelength is formed by light emitted from the first well region 123c of the active layer 123, and the band of the shorter wavelength is formed by light emitted from the second well region 123d formed in the V-pit 119v.

Meanwhile, the EL spectrum of the Inventive Example 1 shows the distinct bands in the longer wavelength range and the shorter wavelength range, and an intensity of each band is relatively stronger than that of the Comparative Example 1. The band of the shorter wavelength range of the Inventive Example 1 is formed by light emitted from the second well region 123d and the sub-emission layer 121 in the V-pit 119v, and the band of the longer wavelength range is formed by the first well region 123c of the active layer 123. In particular, light in the shorter wavelength region has a relatively high energy. Accordingly, a portion of light generated from the sub-emission layer 121 is absorbed by the first well region 123c to increase a carrier concentration in the first well region 123c, and accordingly, an intensity of light emitted from the first well region 123c is increased.

Meanwhile, in the EL spectrum, a full width at half maximum of each band of the Inventive Example 1 is narrower than that of each band of the Comparative Example 1. The full widths at half maximum of the shorter and longer wavelength regions of the Inventive Example 1 were about 35 nm and 43 nm, respectively, whereas the full widths at half maximum of the shorter and longer wavelength ranges of the Comparative Example 1 were about 49 nm and 59 nm, respectively. According to exemplary embodiments of the present disclosure, the full width at half maximum of the band of the shorter wavelength range may be adjusted within a range of 30 nm to 40 nm, and the full width at half maximum of the band of the longer wavelength range may be adjusted within a range of 40 nm to 50 nm.

In addition, referring to FIG. 3B, in the EL spectrum of the Inventive Example 1, light of meaningful intensity is observed even in a wavelength range between the band of the shorter wavelength range and the band of the longer wavelength range, and accordingly, the light emitting diode may emit white light having a high color rendering index. That is, in a region between about 475 nm and about 500 nm, which is between a yellow wavelength band that is the longer wavelength range and a blue wavelength band that is the shorter wavelength range, light having a lower emission intensity than those of a peak of the yellow wavelength band and a peak of the blue wavelength band is emitted, and the emission intensity in this region may be substantially constant. Accordingly, light is emitted over an entire wavelength within a range of 400 nm to 650 nm, and thus, white light having a high CRI may be implemented with a nitride semiconductor-based material.

According to the illustrated exemplary embodiment, by disposing the sub-emission layer 121, it is possible to increase the emission intensity of the blue wavelength band together with that of the yellow wavelength band of light emitted from the active layer 123. Furthermore, by disposing the sub-emission layer 121, the intensity of the yellow wavelength band of light emitted from the active layer 123 may be increased. In addition, according to exemplary embodiments of the present disclosure, an intensity of a single peak in the blue wavelength band may be increased, and thus, a cold white color having a correlated color temperature of about 6500K may be implemented, for example. The light emitting diode of the present disclosure may implement white light having a correlated color temperature (CCT) within a range of 3000K to 7000K and CIE color coordinates (X, Y) within a range of $0.205 \leq X \leq 0.495$ and $0.265 \leq Y \leq 0.450$ using the sub-emission layer 121 and the active layer 123, and the CCT may be appropriately adjusted depending on an intended use.

In other exemplary embodiments below, so as to avoid repeated descriptions, differences from the above-described embodiments will be mainly described, and same elements will be briefly described or omitted.

Figure 4:
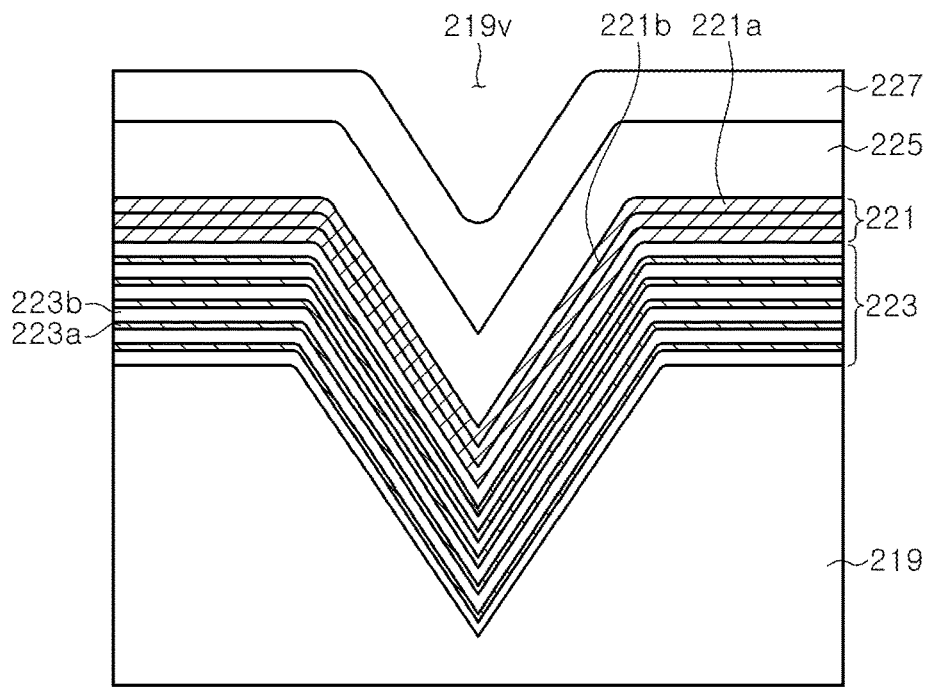
FIG. 4 is a schematic cross-sectional view illustrating a light emitting diode according to another exemplary embodiment.

FIG. 4 is a schematic cross-sectional view illustrating a light emitting diode according to another exemplary embodiment.

Referring to FIG. 4, the light emitting diode according to the illustrated exemplary embodiment is similar to the light emitting diode according to the exemplary embodiment of FIG. 1 except for a location of a sub-emission layer 221. The light emitting diode according to the illustrated exemplary embodiment, which is similar to the light emitting diode of the embodiment of FIG. 1, may include a V-pit generation layer 219, an active layer 223, a sub-emission layer 221, an electron blocking layer 225, and a p-type nitride-based semiconductor layer 227. In addition, although not shown, the light emitting diode may include a substrate, a nucleation layer, a high-temperature buffer layer, and an n-type nitride semiconductor layer. The active layer 223 may include a well layer 223a and a barrier layer 223b.

The sub-emission layer 221 may be disposed between the active layer 223 and the electron blocking layer 225, and may be in contact with an upper portion of the active layer 223. In the illustrated exemplary embodiment, the sub-emission layer 221 may have a plurality of well layers, such as three well layers, without being limited thereto, or may include at least one well layer.

The sub-emission layer 221 may include a first sub-emission region 221a formed over a flat surface of the active layer 223 and a second sub-emission region 221b formed along the active layer 223 formed in a V-pit 219v. An inclined surface in the V-pit 219v may have a relatively low growth rate and thus, a thickness of the second sub-emission region 221b formed on the inclined surface in the V-pit 219v may be formed to be smaller than that of the first sub-emission region 221a. The thickness of the sub-emission layer 221 in the V-pit 219v may vary depending on a size of the V-pit 219v.

In addition, as the sub-emission layer 221 is disposed on the upper portion of the active layer 223, light within a shorter wavelength range generated in the sub-emission layer 221 may be emitted through an upper portion of the substrate 211, that is, a first exiting surface, with a higher extraction efficiency of light than that of light emitted through a lower portion of the substrate 211, that is, a second exiting surface.

The active layer 223 emits light having a wavelength longer than that of light emitted from the sub-emission layer 221. That is, the well layers of the sub-emission layer 221 have energy band gaps wider than those of the well layers 223a of the active layer 223. Since the sub-emission layer 221 adjacent to the p-type nitride semiconductor layer 227 has the relatively wide band gap, holes injected into the active layer 223 adjacent to the n-type nitride semiconductor layer are relatively reduced.

As the active layer 223 having a band gap shallower than that of the sub-emission layer 221 is disposed adjacent to an n-type nitride semiconductor layer (not shown), most of holes injected from the p-type nitride semiconductor layer 227 may be recombined in the sub-emission layer 221 and thus, a recombination rate in the active layer 223 may be relatively low, thereby reducing radiation efficiency. Meanwhile, when light is emitted to the second exiting surface, light having a shorter wavelength range emitted from the sub-emission layer 221 may be at least partially absorbed by the active layer 223 having the shallower band gap.

The light emitting diode according to the illustrated exemplary embodiment is manufactured as a light emitting device having a lateral structure and thus, an extraction efficiency of light generated in the sub-emission layer 221 may be increased.

Figure 5:
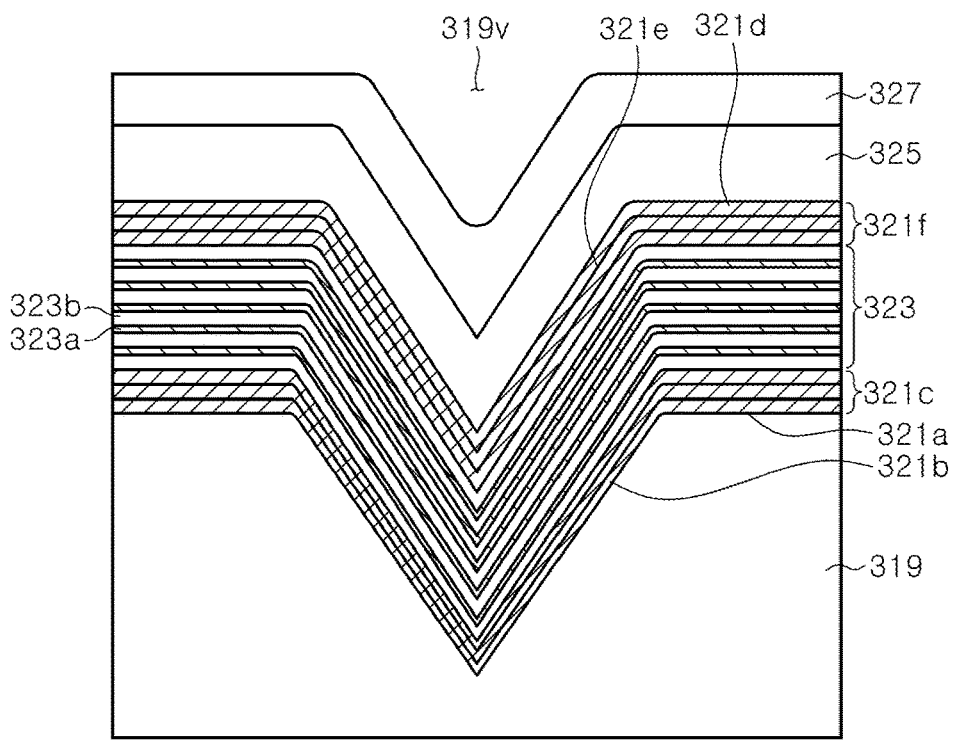
FIG. 5 is a schematic cross-sectional view illustrating a light emitting diode according to another yet exemplary embodiment.

FIG. 5 is a schematic cross-sectional view illustrating a light emitting diode according to another yet exemplary embodiment.

Referring to FIG. 5, the light emitting diode according to the illustrated exemplary embodiment is substantially similar to the light emitting diode according to the exemplary embodiment of FIG. 1, except that sub-emission layers 321c and 321f are disposed on upper and lower portions of an active layer 323, respectively. The light emitting diode according to the illustrated exemplary embodiment, which is similar to the light emitting diode of the embodiment of FIG. 1, may include a V-pit generation layer 319, an active layer 323, a sub-emission layer 321c, an electron blocking layer 325, and a p-type nitride-based semiconductor layer 327. In addition, although not shown, the light emitting diode may include a substrate, a nucleation layer, a high-temperature buffer layer, and an n-type nitride semiconductor layer. The active layer 323 may include a well layer 323a and a barrier layer 323b. Furthermore, the light emitting diode further includes a sub-emission layer 321f disposed on the upper portion of the active layer 323.

Each of the lower sub-emission layer 321c and the upper sub-emission layer 321f may have at least three well layers, without being limited thereto. For example, each of the lower sub-emission layer 321c and the upper sub-emission layer 321f may be formed of at least one well layer, or the number of well layers of each of the lower and upper sub-emission layers 321c and 321f may be different.

The lower and upper sub-emission layers 321c and 321f may include first sub-emission regions 321a and 321d disposed under and over a flat surface of the active layer 323 and second sub-emission regions 321b and 321e formed in a V-pit 319v. An inclined surface in the V-pit 319v may have a relatively low growth rate and thus, thicknesses of the second sub-emission regions 321b formed on the inclined surface in the V-pit 319v may be formed to be smaller than those of the first sub-emission regions 321a and 321d. The thickness of the sub-emission layer 321 in the V-pit 319v may vary depending on a size of the V-pit 319v.

Figure 6A:
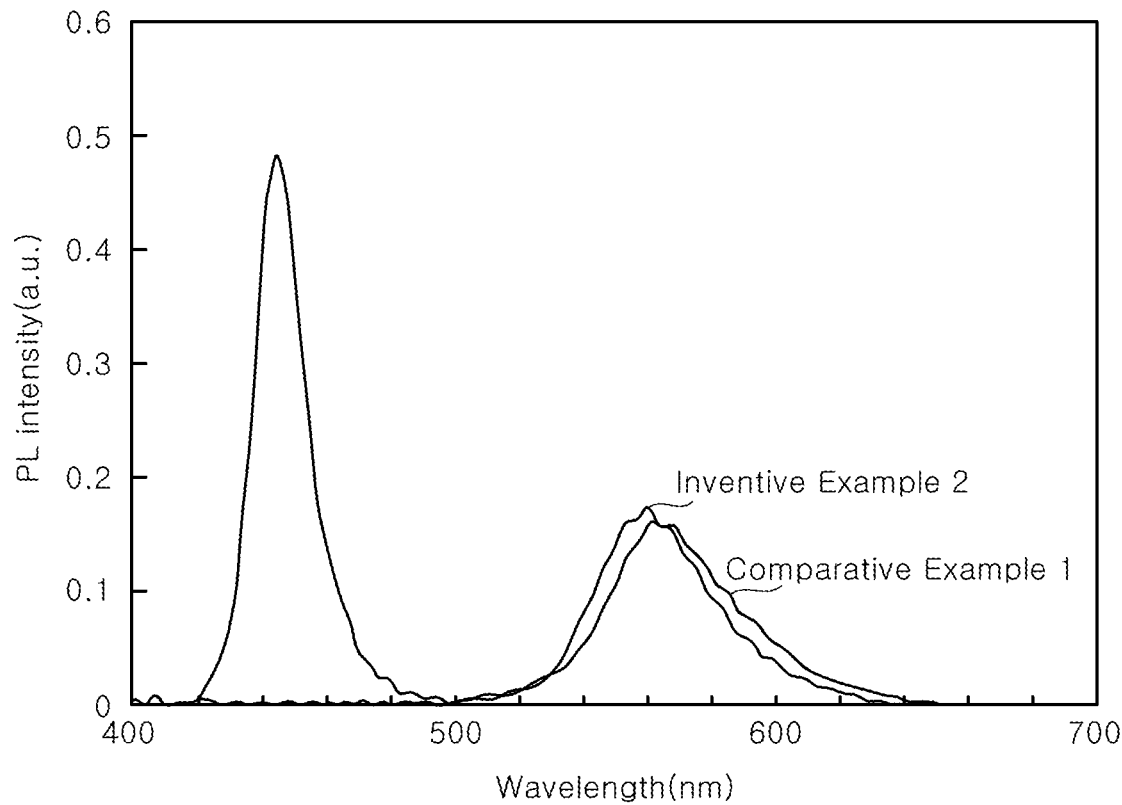
FIG. 6A is a graph showing photoluminescence (PL) intensities of light emitting diodes according to Comparative Example 1 and Inventive Example 2.
Figure 6B:
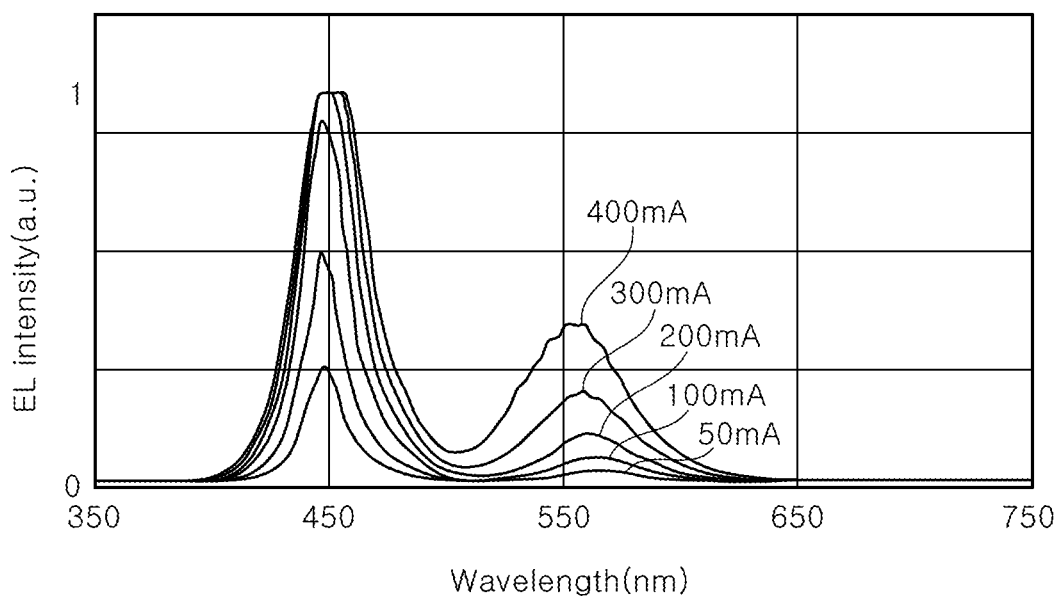
FIG. 6B is a graph showing electroluminescence (EL) intensities of light emitting diodes according to Comparative Example 1 and Inventive Example 2.

FIG. 6A is a graph showing photoluminescence (PL) intensities of light emitting diodes according to Comparative Example 1 and Inventive Example 2, and FIG. 6B is a graph showing electroluminescence (EL) intensities of the light emitting diodes according to Comparative Example 1 and Inventive Example 2. For the light emitting diode of the Inventive Example 2, EL intensities depending on wavelengths were measured in a current range of 50 mA to 400 mA, respectively. The EL spectrum of the light emitting diode of the Comparative Example 1 is shown in FIG. 3B.

The light emitting diodes of the Comparative Example 1 and the Inventive Example 2 have similar structures except for the presence or absence of the sub-emission layers 321c and 321f, and are manufactured by growing semiconductor layers on the substrate under similar process conditions. The light emitting diode of the Inventive Example 2 includes the sub-emission layers 321c and 321f on the lower and upper portions of the active layer 323, respectively, as described with reference to FIG. 5.

First, referring to FIG. 6A, by disposing the sub-emission layers 321c and 321f on the lower and upper portions of the active layer 323, an intensity of light in a yellow wavelength band emitted from the active layer 323 is relatively higher than that of light in a blue wavelength band emitted from the sub-emission layers 321c and 321f. In particular, due to the sub-emission layer 321f disposed on the upper portion of the active layer 323, a PL intensity of the Inventive Example 2 observed in the shorter wavelength range is higher than that of the Inventive Example 1.

Referring to FIG. 6B, in an EL spectrum of the Inventive Example 2, an intensity of light emitted in the shorter wavelength range is higher than that of light emitted in the longer wavelength range. As a current increases from 50 mA to 400 mA, an intensity in each wavelength band also increases and the bands in the longer and shorter wavelength ranges become distinct.

The intensity of light emitted in the shorter wavelength range may be controlled by adjusting locations of the sub-emission layers 321c and 321f and numbers and compositions of well layers of the sub-emission layers 321c and 321f. In addition, as the sub-emission layers 321c and 321f are disposed on the lower and upper portions of the active layer 323, intensities of light in the shorter wavelength range emitted to a first exiting surface as well as to a second exiting surface may be increased. Light in the shorter wavelength range emitted from the lower sub-emission layer 321c may be at least partially absorbed by the active layer 323 before being emitted to the first exiting surface, but light in the shorter wavelength range emitted from the upper sub-emission layer 321f may compensate light in the shorter wavelength range.

The light emitting diode according to the illustrated exemplary embodiment may be applied to both a light emitting device having a lateral structure in which light is emitted to the first exiting surface or a light emitting device having a flip-chip type or vertical structure in which light is emitted to the second exiting surface. However, light emitted to the second exiting surface may be absorbed and scattered by the substrate, so that the light extraction efficiency on the second exiting surface may be lower than that on the first exiting surface. Accordingly, in consideration of the light extraction efficiency, the light emitting diode according to the illustrated exemplary embodiment may be more suitable for the light emitting device having the lateral structure.

Figure 7:
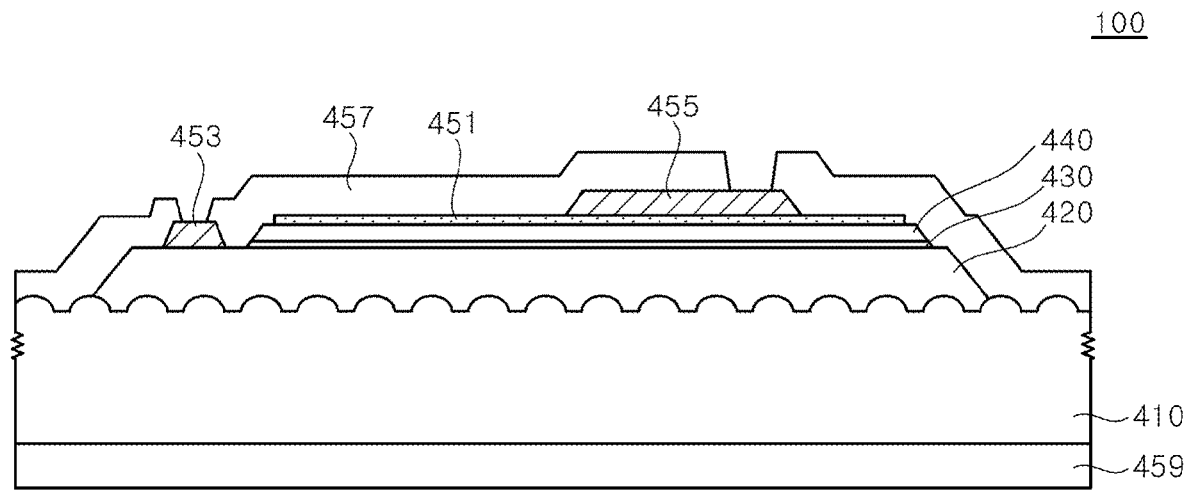
FIG. 7 is a schematic cross-sectional view illustrating a lateral type light emitting device according to an exemplary embodiment.

FIG. 7 is a schematic cross-sectional view illustrating a lateral type light emitting device 100 according to an exemplary embodiment.

Referring to FIG. 7, the light emitting device 100 according to the illustrated exemplary embodiment may include a substrate 410, an n-type semiconductor layer 420, an active layer 430, a p-type semiconductor layer 440, an ohmic electrode 451, an n-type electrode 453, a p-type electrode 455, a light transmitting layer 457, and a reflection film 459. In the illustrated exemplary embodiment, the n-type semiconductor layer 420 may include the nucleation layer, the high-temperature buffer layer, and the n-type nitride semiconductor layer described with reference to FIG. 1. In addition, the active layer 430 may include the sub-emission layer and the active layer as described with reference to FIG. 1, FIG. 4, or FIG. 5. In addition, in the illustrated exemplary embodiment, the p-type semiconductor layer may include the electron blocking layer and the p-type nitride semiconductor layer described with reference to FIG. 1. That is, the light emitting device 100 according to the illustrated exemplary embodiment includes the ohmic electrode 451, the n-type electrode 453, the p-type electrode 455, the light transmitting layer 457, and the reflection film 459 in addition to the elements of the light emitting diodes described with reference to FIG. 1, FIG. 4, or FIG. 5.

The light emitting device 100 includes a light emitting diode having a spectrum of a plurality of bands described above and has a lateral structure. The p-type semiconductor layer 440 and the active layer 430 may be partially removed through an etching process, the n-type semiconductor layer 420 may be exposed, and the n-type electrode 453 may be formed on the exposed the n-type semiconductor layer 420. Meanwhile, the ohmic electrode 451 may be in ohmic contact with the p-type semiconductor layer 440, and the p-type electrode 455 may be formed on the ohmic electrode 451. The light transmitting layer 457 may cover upper portions and side surfaces of the n-type semiconductor layer 420, the active layer 430, and the p-type semiconductor layer 440. The light transmitting layer 457 may have openings exposing the n-type electrode 453 and the p-type electrode 455.

The light transmitting layer 457 may be formed of a single layer, without being limited thereto, or may include multi-layers. The light transmitting layer 457 may include a light transmitting insulating oxide film such as $SiO_2$, SiNx, $Al_2O_3$, $Nb_2O_5$, $TiO_2$, $MgF_2$, or the like.

The reflection film 459 may be disposed on a lower portion of the substrate 410 opposite to the light transmitting layer 457. The reflection film 459 may include a distributed Bragg reflector or a metal reflector.

Figure 8:
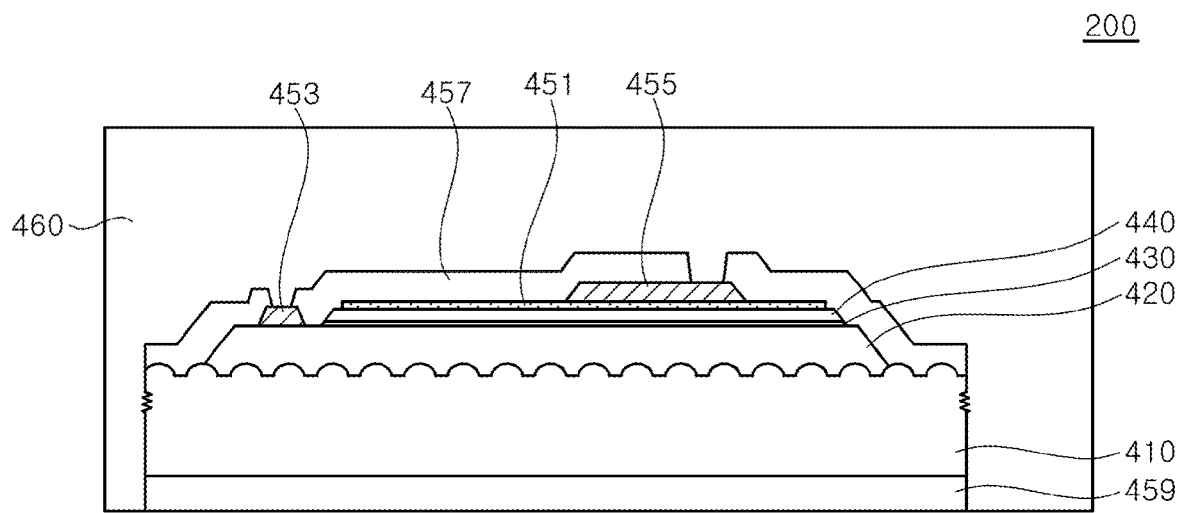
FIG. 8 is a schematic cross-sectional view illustrating a lateral type light emitting device according to another exemplary embodiment.

FIG. 8 is a schematic cross-sectional view illustrating a lateral type light emitting device 200 according to another exemplary embodiment.

The light emitting device 200 according to the illustrated exemplary embodiment has a structure substantially similar to that of the light emitting device 100 described with reference to FIG. 7, except that it further includes a second light transmitting layer 460.

In more detail, the lateral type light emitting device of FIG. 8 includes a first light transmitting layer 457 and a second light transmitting layer 460. The first light transmitting layer 457 may be identical to the light transmitting layer 457 described with reference to FIG. 7, and the second light transmitting layer 460 may include an epoxy molding compound (EMC), polyimide, or a material such as silicone, or the like. The second light transmitting layer 460 may have a structure different from that of the first light transmitting layer 457, may be formed in an upper portion of the substrate 410, and may cover a side surface of the substrate 410 as well as the upper portion thereof, as shown in FIG. 8.

In FIG. 7, the light transmitting layer 457 may be formed of multi-layers, or as in FIG. 8, a multi-layered light transmitting layer may be formed by additionally forming the second light transmitting layer 460 on the first light transmitting layer 457. When the light transmitting layer is formed of the multi-layers, the light transmitting layer may include an anti-reflective coating (AR). The multi-layers may include, for example, a metal oxide such as $SiO_2$, $Al_2O_3$, $HfO_2$, $Y_2O_3$, $TiO_2$ or a metal fluoride such as $MgF_2$, $CaF_2$, $LaF_3$, or $Na_3AlF_6$.

The anti-reflective coating may be designed in consideration of a peak wavelength of light generated in the active layer 430. First, to increase an extraction efficiency of the peak wavelength of light generated in the active layer 430, the anti-reflective coating may be designed such that a transmittance in a corresponding peak wavelength band is close to 100%. In addition, the anti-reflective coating may be designed so as to have high transmittance for light generated in the active layer 430 as well as light of a shorter wavelength band and a longer wavelength band of visible light so as to improve CRI.

Figure 9:
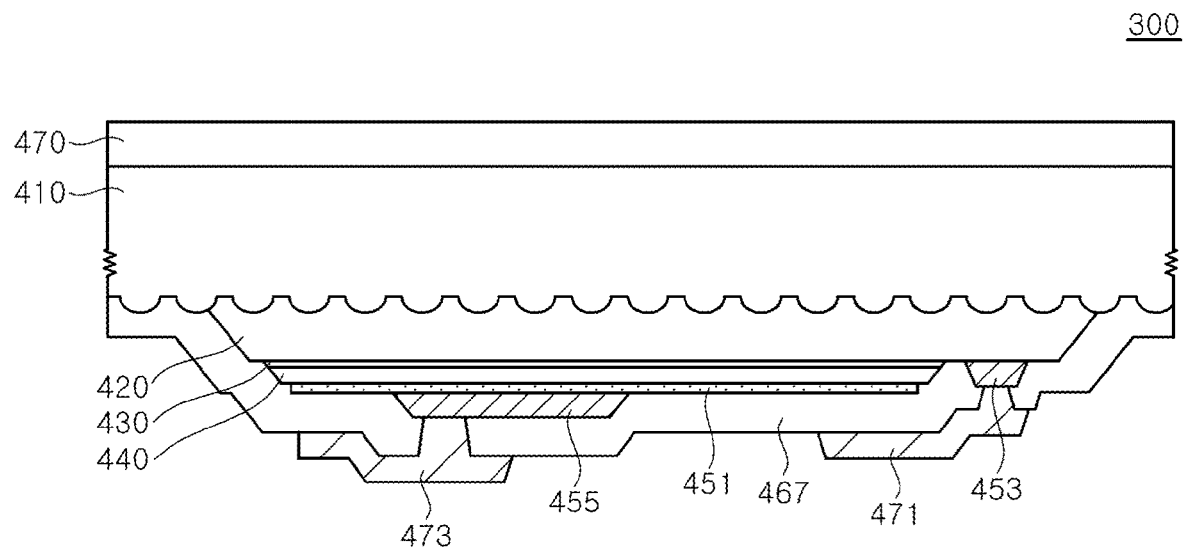
FIG. 9 is a schematic cross-sectional view illustrating a flip-chip type light emitting device according to another exemplary embodiment.

FIG. 9 is a schematic cross-sectional view illustrating a flip-chip type light emitting device 300 according to another exemplary embodiment.

Referring to FIG. 9, the light emitting device 300 according to the illustrated exemplary embodiment is substantially similar to the light emitting device 100 described with reference to FIG. 7, but it further includes an n-type bump electrode 471 and a p-type bump electrode 473, and locations of a light transmitting layer 470 and a reflection film 467 are different from those of the light transmitting layer 457 and the reflection film 459.

The light transmitting layer 470 is disposed on the substrate 410 to be opposite to the n-type semiconductor layer 420, and the reflection film 467 covers the n-type semiconductor layer 420, the p-type semiconductor layer 440, the ohmic electrode 451, the n-type electrode 453, and the p-type electrode 455. In addition, the reflection film 467 has openings exposing the n-type electrode 453 and the p-type electrode 455.

The n-type bump electrode 471 is electrically connected to the n-type electrode 453 through the opening of the reflection film 467, and the p-type bump electrode 473 is electrically connected to the p-type electrode 455 through the opening of the reflection film 467.

The light emitting device 300 may be flip-bonded on a circuit board using the n-type bump electrode 471 and the p-type bump electrode 473. Meanwhile, light generated in the active layer 430 may be emitted to the outside through the substrate 410 and the light transmitting layer 470.

In the illustrated exemplary embodiment, the light-transmitting layer 470 may be formed of an identical material as those of the light-transmitting layers 457 and 460 as described with reference to FIG. 7 or FIG. 8. The light transmitting layer 470 may also cover a side surface of the substrate 410 as well as an upper surface thereof.

Figure 10:
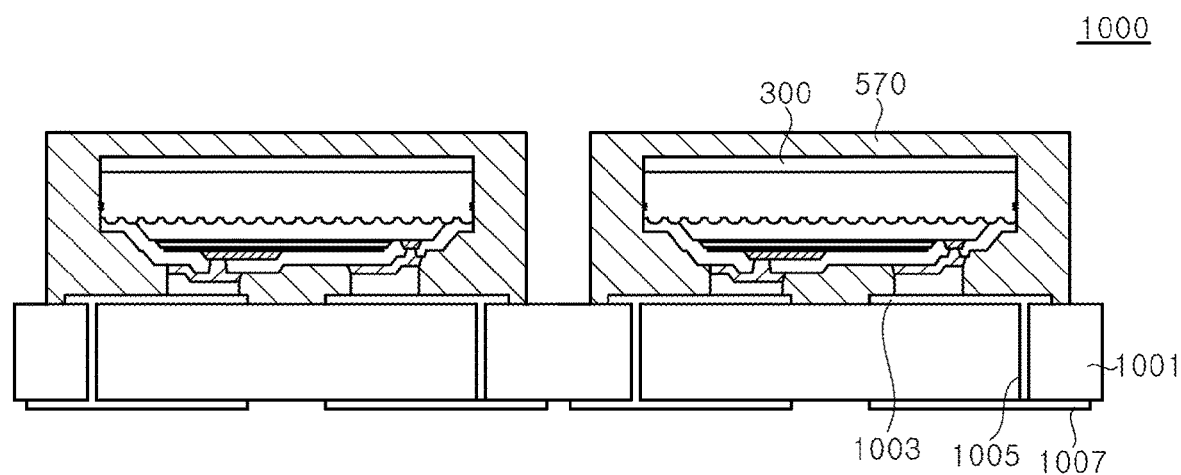
FIG. 10 is a schematic cross-sectional view illustrating a light emitting module according to an exemplary embodiment.

FIG. 10 is a schematic cross-sectional view illustrating a light emitting module 1000 according to an exemplary embodiment.

Referring to FIG. 10, the light emitting module 1000 may include a circuit board 1001, light emitting devices 300, and a light transmitting layer 570.

The circuit board 1001 has a circuit pattern for supplying power to the light emitting devices 300. For example, interconnections 1003 may be disposed on an upper surface of the circuit board 1001, pads 1007 may be disposed on a lower surface of the circuit board 1001, and the interconnections 1003 and the pads 1007 may be connected through vias 1005. The circuit board 1001 may include circuit patterns of multi-layers.

The light emitting devices 300 may be mounted on the circuit board 1001. The light emitting devices 300 may be flip-chip type light emitting devices as those described with reference to FIG. 9, without being limited thereto. For example, in the light emitting device 300, the light transmitting layer 570 may be omitted.

The light emitting device 300 may be bonded to the interconnections 1003 of the circuit board 1001 using the n-type bump electrode 471 and the p-type bump electrode 473. A plurality of light emitting devices 300 may be disposed on the circuit board 1001 in various arrangements. The light emitting devices 300 may be connected to one another in series or in parallel using the interconnections 1003 on the circuit board 1001, and may be electrically connected to the interconnections 1003 on the circuit board 1001 so as to enable individual driving.

The light transmitting layer 570 may cover an upper surface and a side surface of the light emitting device 300. As shown in FIG. 10, each of the light emitting devices 300 may be individually covered with the light transmitting layer 570, without being limited thereto, or one light transmitting layer 570 may cover the plurality of light emitting devices 300.

A material of the light transmitting layer 570 is not particularly limited, and it may include, for example, an epoxy molding compound (EMC), polyimide, silicone, or the like. In addition, the light transmitting layer 570 may contain a red phosphor so as to improve CRI of white light. The red phosphor may improve CRI of white light by wavelength-converting a portion of light generated in the light emitting devices 300 into red light.

Figure 11A:
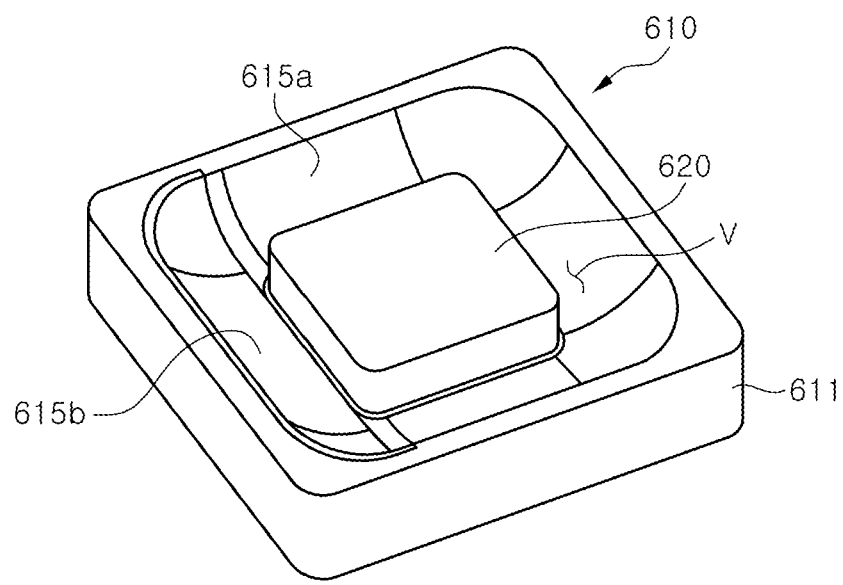
FIG. 11A is a perspective view illustrating a light emitting diode package to which a light emitting diode according to an exemplary embodiment is applied.
Figure 11B:
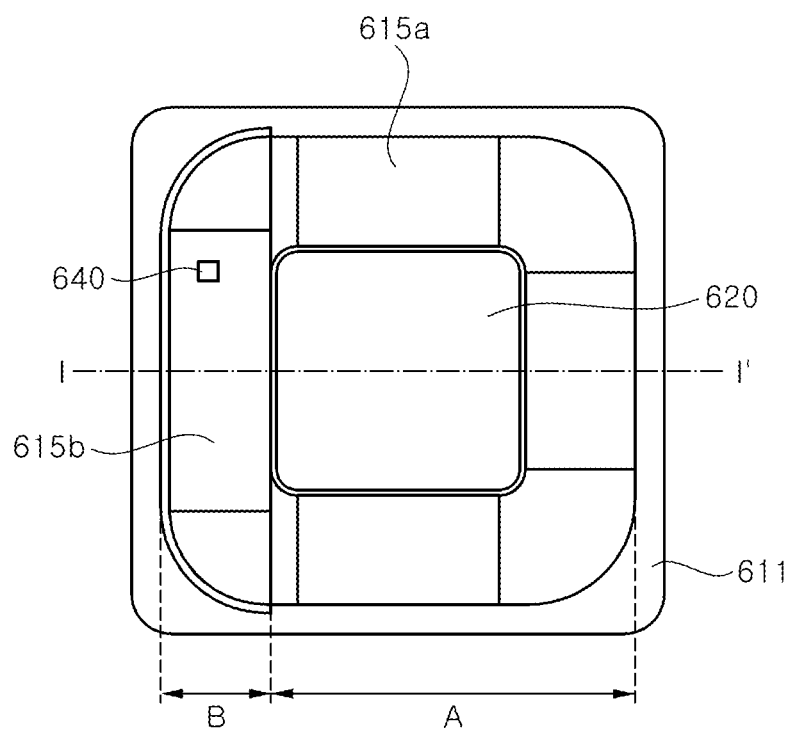
FIG. 11B is a plan view of FIG. 11A.
Figure 11C:
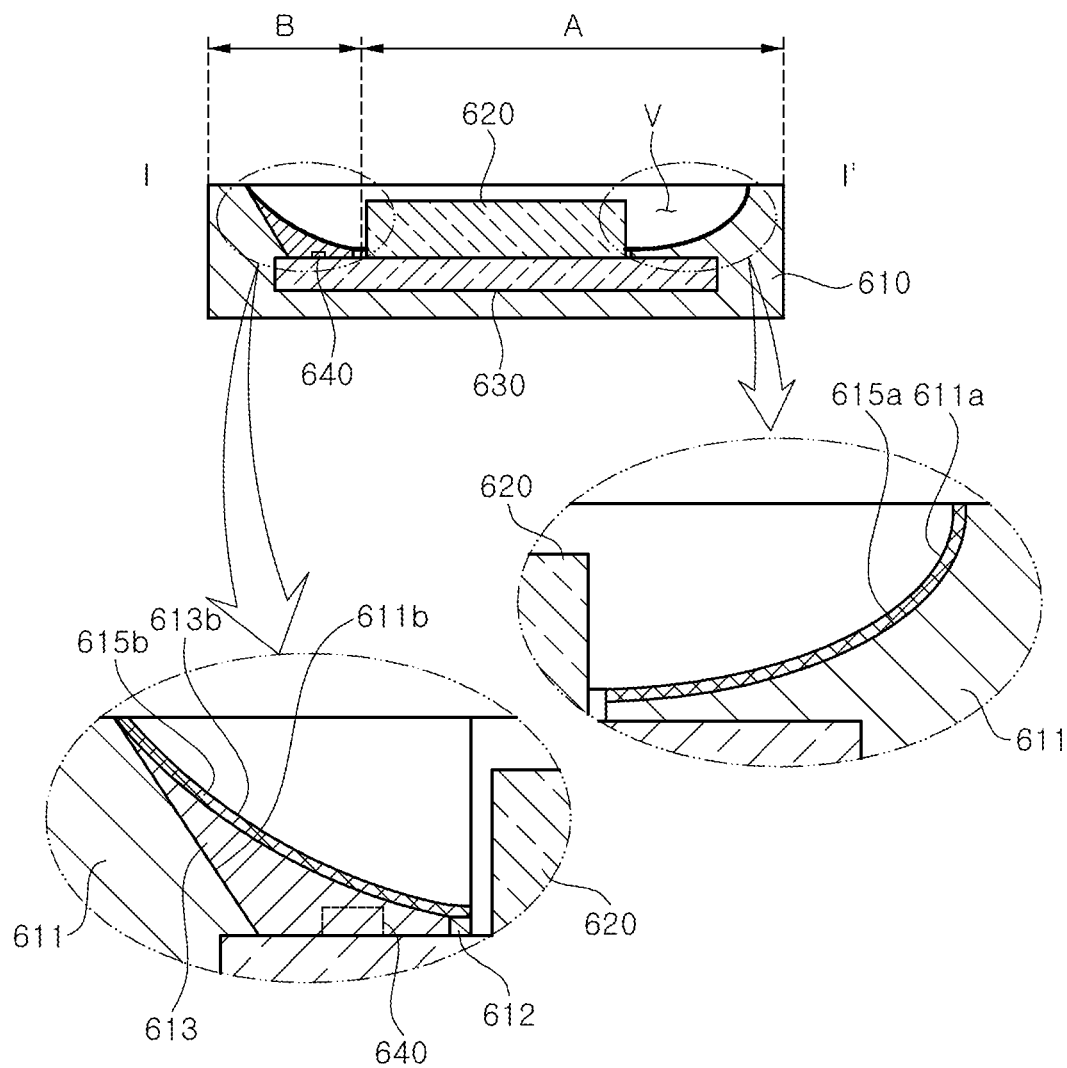
FIG. 11C is a cross-sectional view taken along line I-I' of its corresponding plan view shown in FIG. 11B.

FIG. 11A is a perspective view illustrating a light emitting device package 2000 to which a light emitting diode according to an exemplary embodiment is applied, FIG. 11B is a plan view of FIG. 11A, and FIG. 11C is a cross-sectional view taken along line I-I' of its corresponding plan view shown in FIG. 11B.

Referring to FIG. 11A, FIG. 11B, and FIG. 11C, the light emitting device package 2000 may include a housing 610, a light emitting device 620, a lead frame 630, and a Zener diode 640.

In the illustrated exemplary embodiment, the housing 610 includes a body 611, a cover 613, and a coating portion 615. The body 611, as illustrated, may have a substantially quadrangular shape in plan view, and may have a shape surrounding the lead frame 630 so as to support the lead frame 630. The housing 610 may have a cavity V with one surface open therein, and the light emitting device 620 may be disposed in the cavity V.

Here, a depth of the cavity V may be greater than a height of the light emitting device 620. In this case, as shown in FIG. 11B and FIG. 11C, the body 611 may be divided into a region A and a region B. The region A may be a region in which the light emitting device 620 is mounted, and the region B may be a region in which the Zener diode 640 is mounted.

Looking at the region A of the body 611, inclined surfaces of the cavity V surrounding the light emitting device 620 may have an identically inclined surface with respect to the light emitting device 620. In this case, a first body inclined surface 611a formed in the region A may be formed as a curved surface, as shown in FIG. 11C, and may be formed such that an inclination of the curved surface becomes steeper toward an upper portion thereof.

The first body inclined surface 611a formed in the region A is formed on the cavities V of three surfaces of the light emitting device 620 except for one surface of the light emitting device 620. In this case, an inner side of the first body inclined surface 611a may be disposed near a location where the light emitting device 620 is mounted. Accordingly, light emitted from the light emitting device 620 may be reflected from the first body inclined surface 611a to be emitted upward the light emitting device package 2000.

And, as shown in FIG. 11C, a second body inclined surface 611b formed in the region B may have a straight line in cross-sectional view in the illustrated exemplary embodiment. However, when the first body inclined surface 611a is formed as the inclined surface, the cross-sectional shape of the second body inclined surface 611b is not limited to the straight line, or may be formed as a curved shape.

As it can be seen in FIG. 11B, a width of the region B in a longitudinal direction may be greater than a width of the region A in the longitudinal direction. Accordingly, a space in which the cover 613 is formed so as to cover the second body inclined surface 611b may be secured. This will be described in detail later.

Although not shown, in another exemplary embodiment, the first body inclined surface 611a and the second body inclined surface 611b of the body 611 may be in an inclined linear form, and a step portion having a flat surface may be formed in a middle of the inclined linear form. A corner may be formed at a point where an inclined linear cavity surface and the step portion meet. Since an area of an inner inclined surface of the cavity V is increased through this, a bonding area with an encapsulant filling the inside of the cavity V is increased and a moisture permeation path is lengthened, and thus, reliability of the device may be improved. In addition, when the encapsulant is formed in a form of double molding, a first formed encapsulant contacts the corner and is formed to have an elevation not exceeding the corner due to surface tension, and a secondary encapsulant may be formed from an upper portion of the first formed encapsulant to an elevation of the body 611.

The cover 613 is disposed so as to cover the second body inclined surface 611b formed in the region B, as shown in FIG. 11C. The cover 613 is formed to have a thickness sufficient to cover the Zener diode 640 disposed in the region B, and is formed not to exceed a stepped portion 612. And, the cover 613, as illustrated, may have a cover inclined surface 613b formed as a gently inclined surface. The cover inclined surface 613b may be formed as a curved surface, and may be formed so as to have a gently inclined surface from an upper portion to a lower portion.

Although the cover portion 613 has been described as being formed so as not to exceed the stepped portion 612, without being limited thereto, a portion of the cover 613 may be formed beyond the stepped portion 612 to a location where the light emitting device 620 is mounted, if necessary. That is, the cover 613 may be formed so as to cover the second body inclined surface 611b and the Zener diode 640 using a viscous material including a reflective material. In this case, the reflective material may be $TiO_2$, $Al_2O_3$, or the like.

As the cover 613 is formed in the region B, the cover inclined surface 613b formed in the cavity V of the light emitting device package 2000 may be formed in a shape similar to that of the first body inclined surface 611a. Accordingly, all surfaces of a reflection surface formed in the cavity V may be formed to be substantially identical with respect to the light emitting device 620.

The coating portion 615 is formed so as to cover the first body inclined surface 611a and the cover inclined surface 613b using a coating material including a reflective material. In this case, the reflective material may be $TiO_2$, $Al_2O_3$, or the like. That is, the coating portion 615 may be formed so as to cover an entire region except for the light emitting device 620 in the cavity V of the light emitting device package 2000. To this end, an upper portion of the light emitting device 620 is masked, and the coating portion 615 may be formed on the first body inclined surface 611a and the cover inclined surface 613b in an upper portion of the cavity V of the light emitting device package 2000 using methods such as spraying, dispensing, jetting, film attaching, sputtering, e-beam deposition, and the like. Accordingly, a first coating inclined surface 615a may be formed in the region A of the cavity V of the light emitting diode package 2000, and a second coating inclined surface 615b may be formed in the region B.

An encapsulant for protecting the light emitting device 620 may be formed in a cavity region of the light emitting device package 2000. The encapsulant may be formed of a light-transmitting material, and for example, a material such as silicone may be used. To implement white light with improved CRI, a red phosphor may be included in the encapsulant. Examples of a phosphor emitting light in a red wavelength range may include a nitrogen-containing aluminosiliconcalcium(CASN or SCASN)-based phosphor (e.g., (Sr, Ca)AlSiN$_3$:Eu). In addition, a manganese-activated fluoride-based phosphor (a phosphor represented by General Formula (I) $A_2[M_{1-a}Mn_aF_6]$). However, in General Formula (I), A is at least one selected from a group consisting of K, Li, Na, Rb, Cs and NH$_4$, M is at least one type of elements selected from a group consisting of a group 4 elements and a group 14 elements, and 0<a<0.2. A representative example of the manganese-activated fluoride-based phosphor is a phosphor of manganese-activated potassium silicon fluoride (e.g., K$_2$SiF$_6$:Mn). In addition, there is a manganese-activated phosphor (a phosphor represented by General Formula (II) $(A_{4-aBa})_{m/2+n/2\times2m}[MX_4O_2]n$) based on an oxiodohalide host lattice. However, in the General Formula (II), A is hydrogen (H) and/or deuterium (D), B is Li, Na, K, Rb, Cs, NH$_4$, ND$_4$, and/or NR$_4$, wherein R is an alkyl or aryl radical, X is F and/or Cl, M is Cr, Mo, W and/or Re, and 0≤a≤4, 0<m≤10, and 1≤n≤10.

In the illustrated exemplary embodiment, the light emitting device 620 may be a flip-chip type light emitting device similar to the flip-chip type light emitting device 300 of FIG. 9, without being limited thereto, or it may be a light emitting device similar to the lateral light emitting device 100 or 200 of FIG. 7 or FIG. 8. The light emitting device 620 may include the light emitting diode described with reference to FIG. 1, FIG. 4, or FIG. 5.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:
1. A light emitting module, comprising:
   a circuit board;
   a light emitting device arranged on the circuit board; the light emitting device, comprising:
      a light emitting diode, comprising:
         a first type nitride semiconductor layer;
         a second type nitride semiconductor layer;
         a V-pit generation layer disposed between the first type nitride semiconductor layer and the second type nitride semiconductor layer and having V-pits;
         an active layer disposed between the V-pit generation layer and the second type nitride semiconductor layer, and including a first well region formed along a flat surface of the V-pit generation layer and a second well region formed in the V-pit of the V-pit generation layer;
         a sub-emission layer disposed between the V-pit generation layer and the second type nitride semiconductor layer; and
         a light transmitting layer covering the first type nitride semiconductor layer or the second type nitride semiconductor layer and including a light emission surface,
      wherein the sub-emission layer emits light having a peak wavelength within a range of wavelengths shorter than a peak wavelength of the first well region, and light emitted from the light transmitting layer is within a range of 0.205≤X≤0.495 in CIE color coordinates (X, Y), and
      wherein the light emission surface of the light transmitting layer is closer to the sub-emission layer than the active layer.
2. The light emitting module of claim 1, wherein the active layer emits light having at least two different peak wavelengths at a single chip level, and wherein energy from the light emitted by the sub-emission layer increases an intensity of the light at each of the at least two different peak wavelengths.

3. The light emitting module of claim 2, wherein the first well region has an Indium (In) content greater than an In content of the second well region.

4. The light emitting module of claim 3, wherein the first well region emits light having a yellow peak wavelength within a band of 570 nm to 590 nm, and the second well region emits light having a blue peak wavelength within a band of 400 nm to 500 nm, wherein a full width at half maximum of a band of light having the yellow peak wavelength is in a range of 40 nm to 50 nm.

5. The light emitting module of claim 2, wherein the first well region is thicker than the second well region.

6. The light emitting module of claim 1, wherein the sub-emission layer includes at least one well layer and at least one capping layer.

7. The light emitting module of claim 6, wherein the sub-emission layer has an In content smaller than an In content of the first well region.

8. The light emitting module of claim 7, wherein the sub-emission layer is disposed between the active layer and the V-pit generation layer, the sub-emission layer being in contact with the active layer.

9. The light emitting module of claim 8, wherein the sub-emission layer includes a plurality of V-pits.

10. The light emitting module of claim 8, wherein the sub-emission layer has an energy band gap wider than an energy band gap of the first well region.

11. The light emitting module of claim 8, wherein a lattice constant of the sub-emission layer has a value that is intermediate between a lattice constant of the V-pit generation layer and a lattice constant of the active layer.

12. The light emitting module of claim 7, wherein the sub-emission layer is in contact with an upper portion of the active layer.

13. The light emitting module of claim 7, wherein the sub-emission layer further includes a plurality of layers having a lower sub-emission layer and an upper sub-emission layer;
the lower sub-emission layer is in contact with a lower portion of the active layer; and
the upper sub-emission layer is in contact with an upper portion of the active layer.

14. The light emitting module of claim 1, wherein the sub-emission layer, the first well region, and the second well region are configured to emit light having at least three different peak wavelengths at a single chip level.

15. The light emitting module of claim 14, wherein the sub-emission layer emits blue light,
the second well region emits blue light having a peak wavelength within a range of shorter wavelengths or longer wavelengths than a wavelength range of the sub-emission layer, and
the first well region emits yellow light.

16. The light emitting module of claim 1, further comprising:
an electron blocking layer between the active layer and the p-type nitride semiconductor.

* * * * *